US009035653B2

(12) United States Patent
Hutter et al.

(10) Patent No.: US 9,035,653 B2
(45) Date of Patent: May 19, 2015

(54) SAMPLING PATTERN FOR ITERATIVE MAGNETIC RESONANCE IMAGE RECONSTRUCTION

(75) Inventors: Jana Hutter, Effeltrich (DE); Peter Schmitt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 456 days.

(21) Appl. No.: 13/592,675

(22) Filed: Aug. 23, 2012

(65) Prior Publication Data

US 2013/0049752 A1 Feb. 28, 2013

(30) Foreign Application Priority Data

Aug. 23, 2011 (DE) .......................... 10 2011 081 411

(51) Int. Cl.
| G01R 33/54 | (2006.01) |
| G01R 33/561 | (2006.01) |
| G01R 33/563 | (2006.01) |

(52) U.S. Cl.
CPC ........ G01R 33/5611 (2013.01); *G01R 33/5635* (2013.01)

(58) Field of Classification Search
CPC ............. G01R 33/5635; G01R 33/561; G01R 33/5611; G01R 33/5608; G01R 33/482
USPC ........... 324/300–322; 600/407–422; 382/131, 382/132
See application file for complete search history.

(56) References Cited

U.S. PATENT DOCUMENTS

| 7,902,823 | B2 | 3/2011 | Griswold et al. |
| 2008/0175458 | A1 | 7/2008 | Guo et al. |
| 2008/0197842 | A1 | 8/2008 | Lustig et al. |
| 2008/0292167 | A1 | 11/2008 | Todd et al. |
| 2011/0286648 | A1* | 11/2011 | Sharif et al. .................. 382/131 |
| 2012/0169338 | A1* | 7/2012 | King et al. ..................... 324/309 |

OTHER PUBLICATIONS

"Variable-Density Parallel Imaging With Partially Localized Coil Sensitivities," CÇukur et al., IEEE Trans. on Medical Imaging, vol. 29, No. 5 (2010), pp. 1173-1181.
"Fast Method for 1D Non-Cartesian Parallel Imaging Using GRAPPA," Heidemann et al., Magnetic Resonance in Medicine, vol. 57 (2007), pp. 1037-1046.
"Second Order Total Generalized Variation (TGV) for MRI," Knoll et al., Magnetic Resonance in Medicine, vol. 65 (2011), pp. 480-491.

(Continued)

*Primary Examiner* — Melissa Koval
*Assistant Examiner* — Rishi Patel
(74) *Attorney, Agent, or Firm* — Schiff Hardin LLP

(57) ABSTRACT

In a method to generate magnetic resonance (MR) images of an examination subject, MR signals are detected simultaneously with multiple coils, each coil having its own coil characteristic. In the detection of the MR signals, raw data space is incompletely filled with MR signals; with raw data space being undersampled in a central raw data region with a coherent acquisition pattern that is composed of a spatially repeating set of raw data points; and raw data space outside of the central raw data region is sampled with an incoherent acquisition pattern. The MR image is reconstructed from the detected MR signals, step-by-step in an iterative reconstruction procedure using a reconstruction matrix A, starting from an initial estimate; wherein the reconstruction matrix has continuing information about the coil characteristics with which the MR signals were detected.

12 Claims, 6 Drawing Sheets

(56) References Cited

OTHER PUBLICATIONS

"Sparse MRI: The Application of Compressed Sensing for Rapid MR Imaging," Lustig et al., Magnetic Resonance in Medicine, vol. 58 (2007), pp. 1182-1195.

"Advances in Sensitivity Encoding With Arbitrary k-Space Trajectories," Pruessmann et al., Magnetic Resonance in Medicine, vol. 46 (2001), pp. 638-651.

* cited by examiner

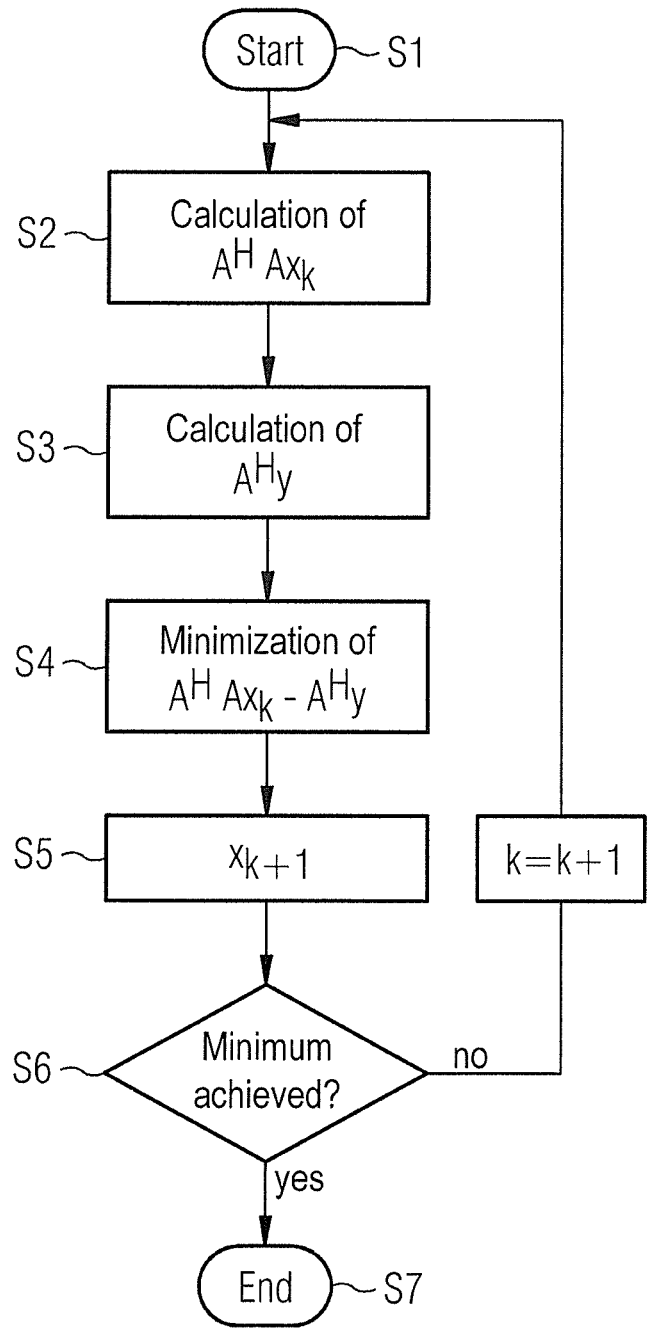

SAMPLING PATTERN FOR ITERATIVE MAGNETIC RESONANCE IMAGE RECONSTRUCTION

BACKGROUND OF THE INVENTION

1. Field of the Invention

The present invention concerns a method to create magnetic resonance (MR) images of an examination subject, and a magnetic resonance system designed to implement such a method.

2. Description of the Prior Art

In MR imaging, parallel imaging methods and iterative reconstruction methods have developed into valuable and promising methods. It is normally a goal to reconstruct optimally "good" MR images from undersampled data, i.e. to optimally acquire the complete image information without having to completely sample the associated raw data space (k-space). This can be done in order to achieve a measurement time that is shortened in comparison to the time that would be necessary to completely scan raw data space, or in order to achieve an optimally high spatial resolution within a predetermined measurement time. The selection of the sampling pattern, i.e. how the raw data space is filled with data entries that correspond to the acquired (detected) MR signals, is important.

Coherent sampling patterns (in which each Nth line in the raw data space is acquired, with N>1, for example) are typical in methods from parallel imaging. Those sampling patterns in raw data space that are composed of a spatially repeating set of raw data points, or from spatially repeating subsamples, or subsets of points, are considered as coherent. A method with the name Caipirinha is likewise known in which a three-dimensional raw data space is acquired with mutually offset patterns that have proven to be generally advantageous with regard to the image reconstruction or with regard to the deconvolution of the data.

In iterative reconstruction methods, sampling patterns with variable density, and in particular incoherent sampling patterns, are normally used. In these incoherent sampling patterns, no subset is to be found that has more than one point from which the acquired complete sampling pattern can be created by rotation and translation. A sampling with such a sampling pattern leads to incoherent artifacts that can likewise be well suppressed by means of suitable regularization within the scope of iterative reconstruction methods. In this context, a continuously incoherent pattern or a completely acquired central raw data region is typically employed, which limits the possibilities for undersampling.

SUMMARY OF THE INVENTION

An object of the present invention is to sample MR raw data space such that MR images with the desired spatial resolution and good signal-to-noise ratio can be acquired in an optimally short acquisition time period, and wherein artifacts occurring due to the undersampling are optimally avoided.

According to a first aspect of the invention, a method is provided to generate MR images of an examination subject. In a first step of this method, MR signals of the examination subject are detected simultaneously with multiple coils, each coil having its own coil characteristic. As a result of the detection of the MR signals, raw data space is incompletely filled with MR signals, and the raw data space has a central raw data region with a coherent acquisition pattern, and this central raw data region is undersampled with the coherent acquisition pattern. An acquisition pattern is coherent in the sense of the present invention when it is composed of a spatially repeating set of raw data points. Outside of this central raw data region, the raw data space is sampled with an incoherent acquisition pattern, i.e. with a pattern that is not composed of spatially repeating sub-patterns or subsets of raw data points. Thus the region of raw data space outside of the central raw data region is now sampled with an incoherent acquisition pattern. In a further step of the method, the MR image is reconstructed with the use of the detected MR signals, with the MR images being reconstructed step-by-step with an iterative reconstruction method using a reconstruction matrix A, starting from an initial estimate. The reconstruction matrix A includes the information about the coil characteristics, such as the Fourier coefficients and information regarding the selected sampling (a projection matrix, for example) with which the MR signals are detected. Through the incorporation of the coil characteristics into the iterative reconstruction methods and through the coherently undersampled central region of the raw data space and the incoherent sampling of the region outside of the central raw data space, the advantages of parallel imaging and the iterative reconstruction methods are combined particularly well. A coherently undersampled middle region that includes information about larger areas and structures can be deconvoluted very well, while the incoherent sampling in the outer region of the raw data space that includes the information with regard to smaller structures and edges proves to be advantageous for the suppression of radio-frequency artifact portions.

The density of the raw data points in the central raw data region is preferably essentially constant. The sampling density of the raw data points in the region outside of the central raw data region can be constant, but can also be chosen to be non-constant in the region outside of the central raw data region (i.e. in the outer raw data region); for example, the sampling density in this outer raw data region can decrease with increasing distance from the raw data space center (i.e. k-space center).

The acquired raw data space can be a 2D raw data space or a three-dimensional raw data space. For example, in both cases each Nth line of the raw data space in the central raw data region can be acquired, while the interval of adjacent lines with MR signals continuously increases in the region outside of the central raw data region. A coherent acquisition pattern in the central raw data region and an incoherent pattern in the outer k-space region are hereby achieved.

For example, in the acquisition of a three-dimensional raw data space, parallel lines that lie on a Cartesian grid can be acquired in the central raw data region, wherein only every Nth line is acquired in one spatial direction. It is likewise possible, in the central raw data region, for every Nth line to also be acquired in a second spatial direction of the central raw data region.

The undersampling in both directions does not need to have the same factor, meaning that M does not necessarily correspond to N.

A regularization or penalty term can be used in the iterative reconstruction method, for example. This regularization or penalty term has the information about the coil characteristics that are used to detect the MR signals. In iterative methods, missing MR data can be supplemented with prior knowledge about the image to be expected. This prior knowledge enters into the optimization through what are known as regularization terms or penalty terms. This means that, in this embodiment, information that specifically refers to the acquired MR data enters into the iteration by the use of the coil characteristics, for example in the form of what are known as coil sensitivity data or coil sensitivity maps. In this context it is possible to acquire the information about the coil characteristics from MR data of the central raw data region. The information about coil sensitivities can be determined in a satisfactory manner from the raw data of the central raw data region. This coil sensitivity information, or the coil characteristics, can also be acquired separately, i.e. before or after the actual MR measurement to generate the MR image.

Furthermore, it is possible to acquire (scan) multiple data sets of a 2-dimensional raw data space or a 3-dimensional raw data space by, in the case of temporally successive data sets, the raw data space is scanned so that complementary raw data points are acquired, meaning that different raw data points are essentially acquired in temporally successive data sets. The sampling pattern of the raw data space of successive data sets in the raw data region can be formed by shifting, mirroring and/or rotation so that complementary raw data points are acquired. It is also possible to use raw data points from other, temporally adjacent data sets to reconstruct one of the data sets. This method is known as "view sharing".

For example, one possible application of the method according to the invention is in the generation of MR images of a vascular structure, i.e. as angiography images. The method is not limited to the generation of MR angiography images, however, and is also applicable in other MR acquisition methods. Furthermore, it is possible for the image reconstruction to be implemented on the basis of subtracted MR images. In MR images, a majority of the examination region is typically a region with very low signal ratios (for example as in angiography images), whereas the vessels have high signal ratios. Given subtracted MR images, the number of image points with high signal ratio is spatially limited to a few image points; most image points have a very low signal intensity. The method is particularly suitable in contrast agent-enhanced MR angiography, meaning that the MR signals are implemented [sic] during or after the administration of a contrast agent.

The invention furthermore concerns an MR system to create MR images that has a sequence controller which is designed to detect MR signals of the multiple coils as has been explained in detail above. Furthermore, an image computer is provided to reconstruct the MR image with the aid of the detected MR signals, wherein the image computer is designed to reconstruct the MR with the interactive reconstruction method described above under consideration of the coil characteristics.

BRIEF DESCRIPTION OF THE DRAWINGS

FIG. 7 is a flowchart showing the basic steps in the iterative reconstruction.

DESCRIPTION OF THE PREFERRED EMBODIMENTS

Figure 1:
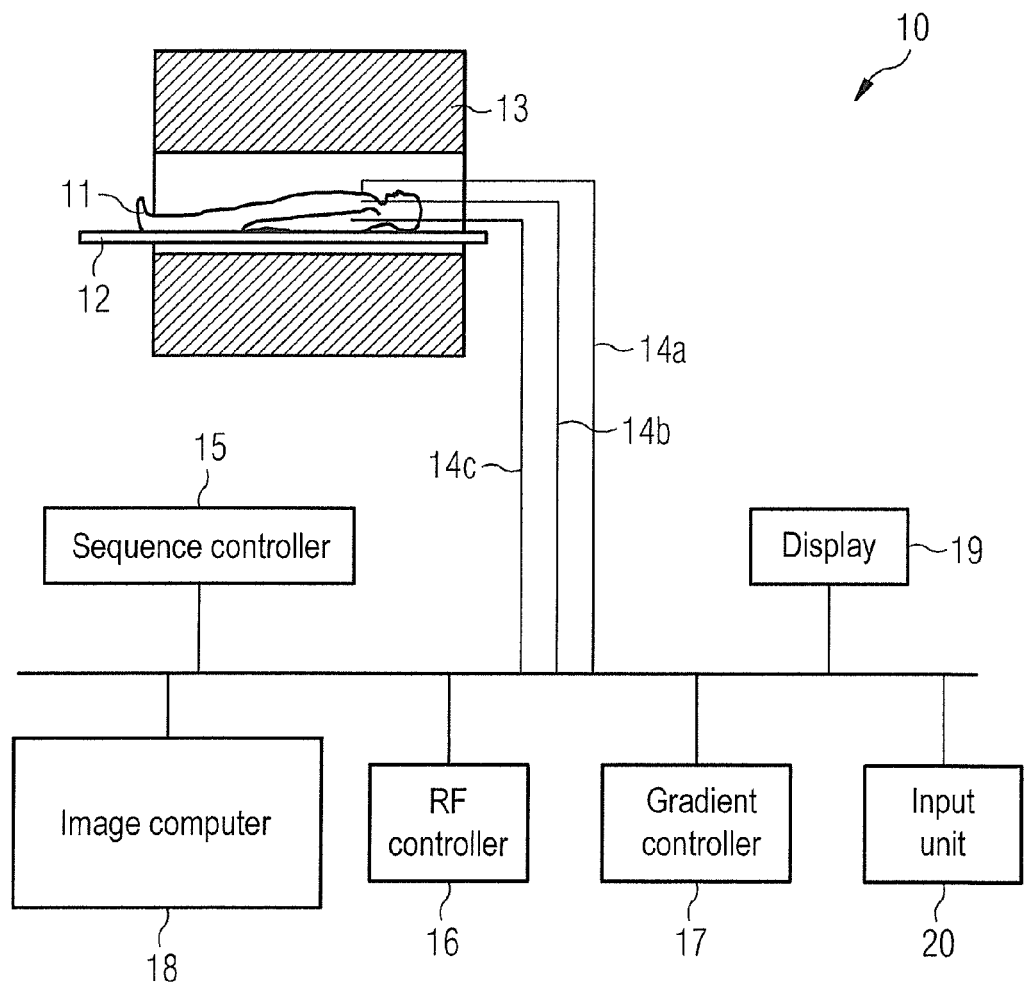
FIG. 1 schematically shows an MR system with which the MR images can be created using parallel imaging technology and iterative reconstruction methods.

An MR system 10 with which MR images of an examination subject 11 that is arranged on a bed 12 can be acquired is schematically shown in FIG. 1. The basic magnetization that is generated by a magnet 13 is spatially coded and deflected by switching magnetic field gradients and RF pulses, with the resulting MR signals are detected with multiple MR signal coils 14a through 14c that are arranged around the examination subject 11. For a clearer representation, only the signal lines emanating from the individual reception coils are labeled with 14a through 14c. Depending on the selected imaging sequence, a sequence controller 15 controls the switching of the magnetic field gradients, the RF pulses and the signal readout and establishes the order of the gradient switching, the radiation of the RF pulses and the signal readout. The sequence controller 15 controls an RF control unit 16 that in turn in responsible for the control of the radiated radio-frequency pulses. A gradient controller 17 is responsible for the switching of the magnetic field gradients that are predetermined by the sequence controller 15. An image computer 18 calculates an MR image from the MR signals detected by the coils 14a through 14c, wherein in the present case the MR images are reconstructed with iterative reconstruction methods, as is explained below in detail. The MR images generated by the image computer 18 can be displayed at a display 19. An operator can control the MR system 10 via an input unit 20. How MR signals can be detected via the sequence of magnetic field gradients and radiation of RF pulses is known to the man skilled in the art and is not explained here in detail.

Figure 2:
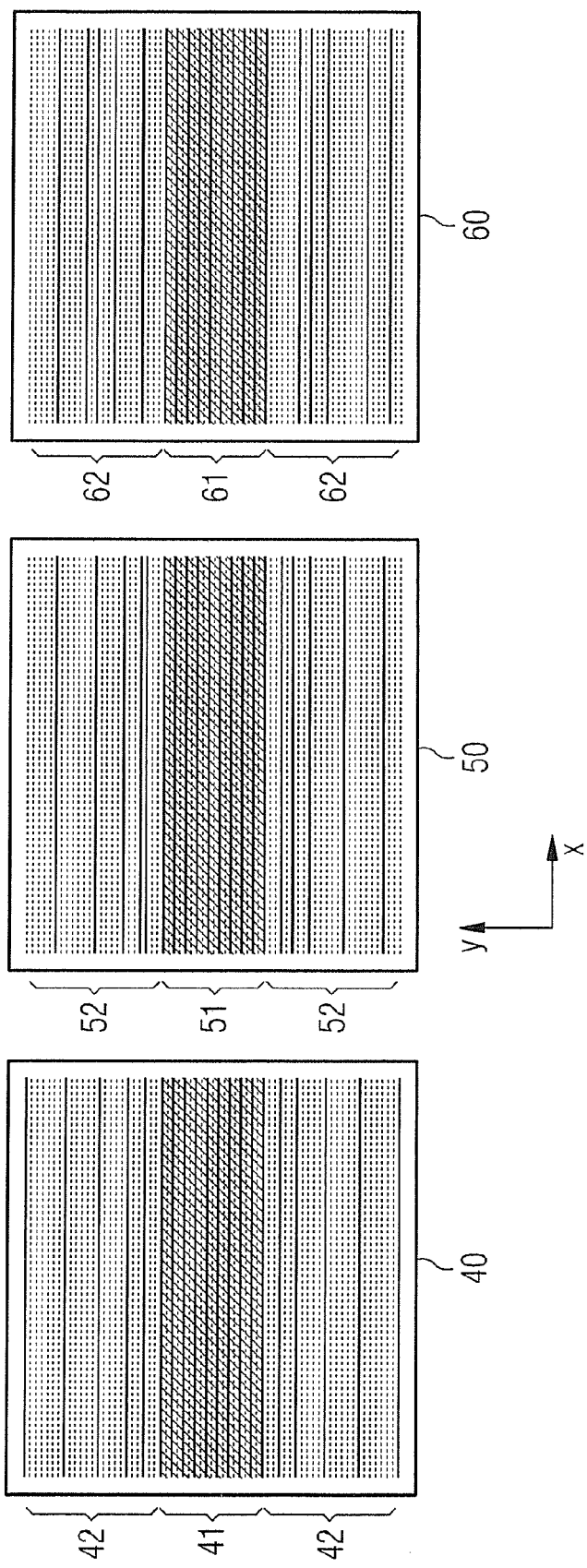
FIG. 2 shows various sampling patterns with coherent sampling of a central raw data region and incoherent sampling of the outer raw data region upon acquisition of a slice.

Various examples of how a raw data space or k-space is filled with raw data (i.e., data entries are made, called "scanning" k-space) are shown in FIG. 2. The sampling patterns shown in FIG. 2 are 2-dimension sampling patterns to create an MR image of a slice from the examination subject. The raw data spaces 40, 50 and 60 presented in FIG. 2 respectively have a central raw data region 41, 51 or, respectively, 61 that has approximately 1-10% of the total raw data points. In the shown raw data space the readout direction takes place along the y-axis. As is apparent from the raw data spaces 40-60, the central raw data region is sampled incompletely but coherently with constant density; in the shown example only every second k-space line is acquired. The outer raw data region (i.e. the region outside of the central raw data region) is sampled incoherently. In the left example, the outer raw data region 42 is sampled with incoherent sampling pattern with continuously decreasing density, meaning that the interval to the next k-space line becomes larger with increasing distance from the k-space center. In the middle raw data set 50 the outer raw data region 52 is irregularly acquired with outwardly decreasing density, and in the example to the right the outer k-space region 62 is sampled irregularly with equally distributed density.

Figure 3:
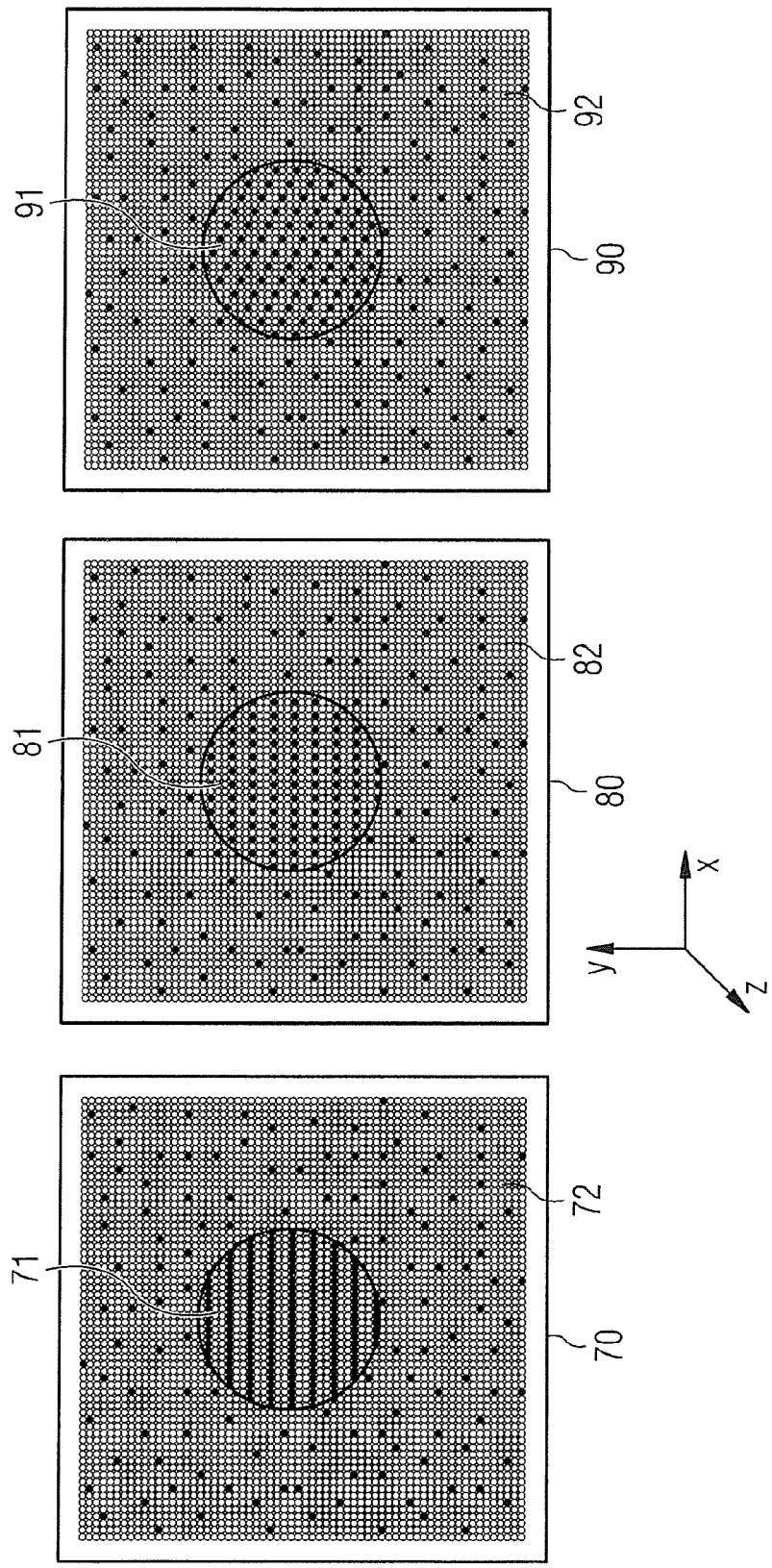
FIG. 3 shows various sampling patterns for 3-dimension sampling of the raw data space with coherent sampling of the central raw data region and incoherent sampling of the outer raw data region.

Various examples of three-dimensional sampling patterns are shown in FIG. 3, wherein a three-dimensional raw data space is acquired with a readout direction into the plane of the drawing or, respectively, out of the plane of the drawing, a phase coding direction in the y-direction and an additional phase coding direction or, respectively, partitioning direction in the direction of the x-axis. The acquired raw data points lie on a Cartesian coordinate system, wherein the signal readout takes place along parallel lines perpendicular to the plane of the drawing. In the raw data space 70 shown to the left, the central raw data region 72 is in turn sampled coherently; here the undersampling is tripled, meaning that only every third line in the phase coding direction is read out. Outside of this the sampling pattern is incoherent with equally distributed density in all three raw data spaces 70-90. This means that the outer raw data regions 72, 82 and 92 are incoherently sampled with identically distributed density. The central raw data region 81 is likewise coherently sampled with an undersampling with a factor of 3×2 (i.e. with a factor of 7 in the phase coding direction, with a factor of 2 in the partitioning direction) since only ever second point in the direction of the z-axis is read out in the direction of the x-axis. The central raw data region 91 is likewise undersampled with a factor of 3×2 like region 81, wherein only the individual lines in the phase coding direction are shifted counter to one another.

Figure 4:
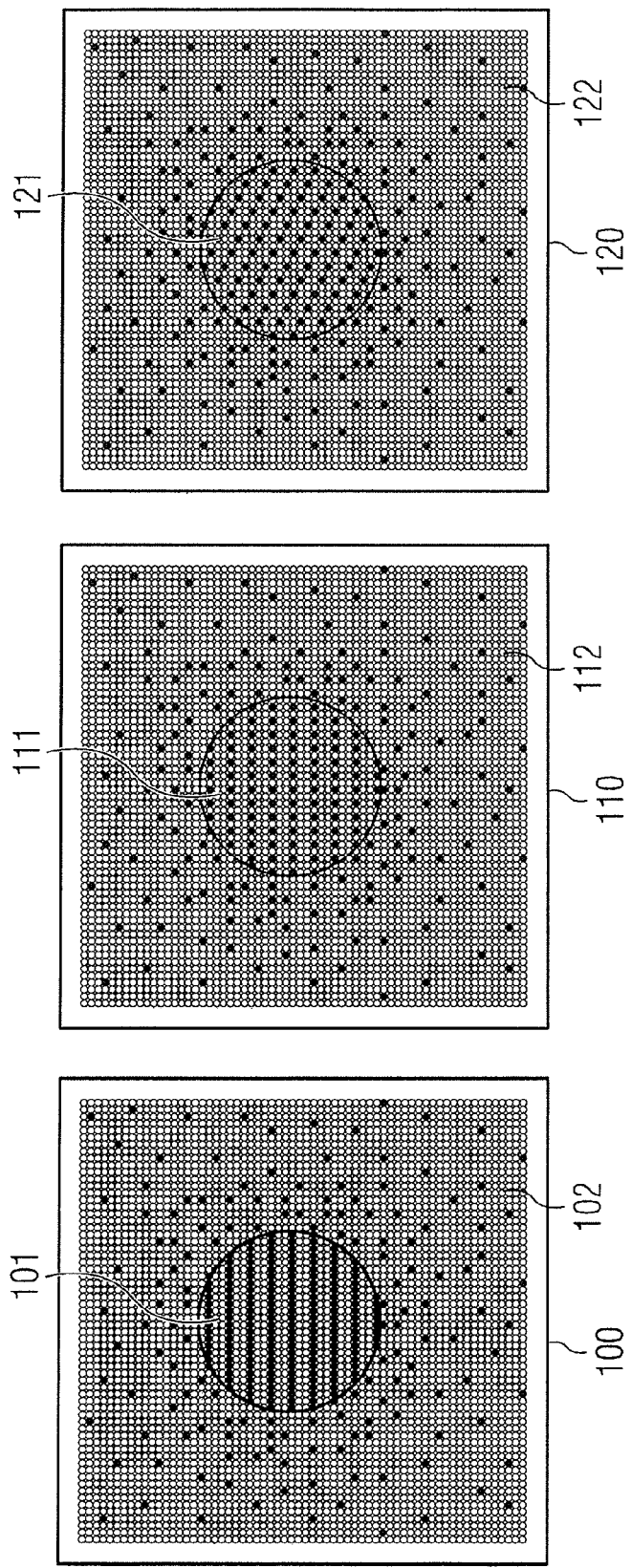
FIG. 4 shows various sampling patterns for 3-dimension acquisition of a raw data space with coherent sampling of the central raw data region and incoherent sampling of the outer raw data region.

Additional examples of 3-dimension raw data spaces 100-120 are shown in FIG. 4. The inner central raw data regions 101, 111 and 121 are again coherently sampled, wherein the patterns in the regions 101, 111 and 121 correspond to the samples in the regions 71, 81 or, respectively, 91. In contrast to the examples of FIG. 3, the outer raw data regions 102, 112, 122 outside of the central raw data region are acquired with density that outwardly decreases.

The central raw data region can have an arbitrary shape around the k-space center; however, the region is advantageously circular, quadratic, elliptical or rectangular.

The sampling patterns presented in FIGS. 2-4 that were acquired with the multiple coils with the use of the parallel imaging technique are reconstructed with an iterative reconstruction method.

Given the use of multiple coils for signal acquisition in the parallel imaging technique, MR signals are simultaneously detected with various reception coils, wherein an undersampling of the raw data space takes place. The image reconstruction takes place using the information of (for example) M coils in combination with the spatial information that is provided by the coil position. This information is stored in coil sensitivity maps that are calculated individually for each coil, for example via acquisition of reference lines. These reference lines can be acquired before or after the actual imaging. Given a 2-dimension acquisition for an image of $N_L \cdot N_C$ image points, a full raw data sampling means the acquisition of $N_L$ image points, wherein $N_C$ image points are sampled per line. To shorten the acquisition time, a low number of lines can be acquired.

The general formula of the image reconstruction is $$y = A \cdot x, \qquad (1)$$

wherein the acquired raw data (i.e. MR signals) are y, the sought MR image is x and the matrix A contains the Fourier coefficients. The image x is obtained via inverse Fourier transformation.

In parallel imaging methods and the spatial information that is thereby additionally obtained, the above Equation (1) is modified via addition of a projection matrix P and the coil characteristic C to the reconstruction matrix A.

The method described in the following is only one possibility of the iterative parallel MR imaging.

The image reconstruction is formulated as a linear system:

$$y = Ax \qquad (2)$$

Figure 5:
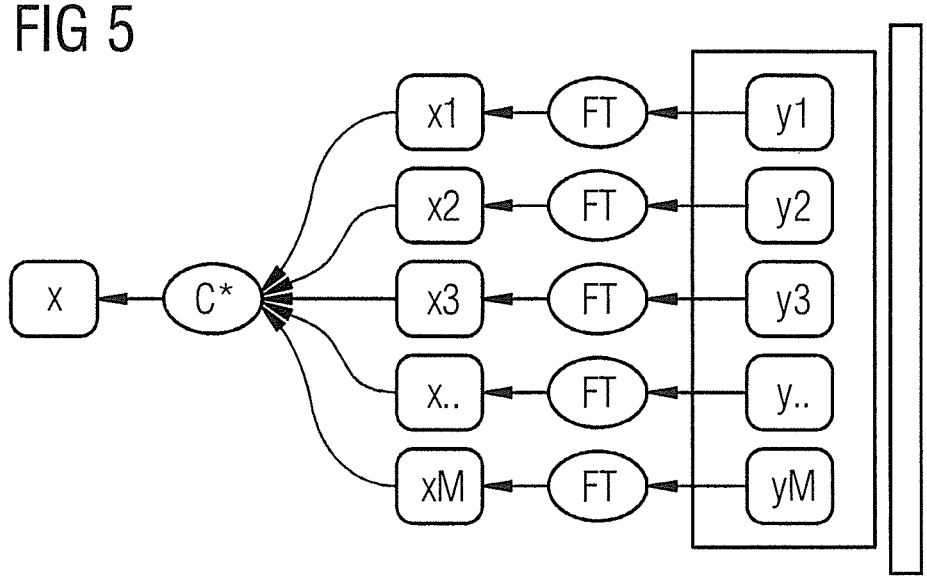
FIGS. 5 and 6 illustrate the connection between the MR image and acquired measurement data.
Figure 6:
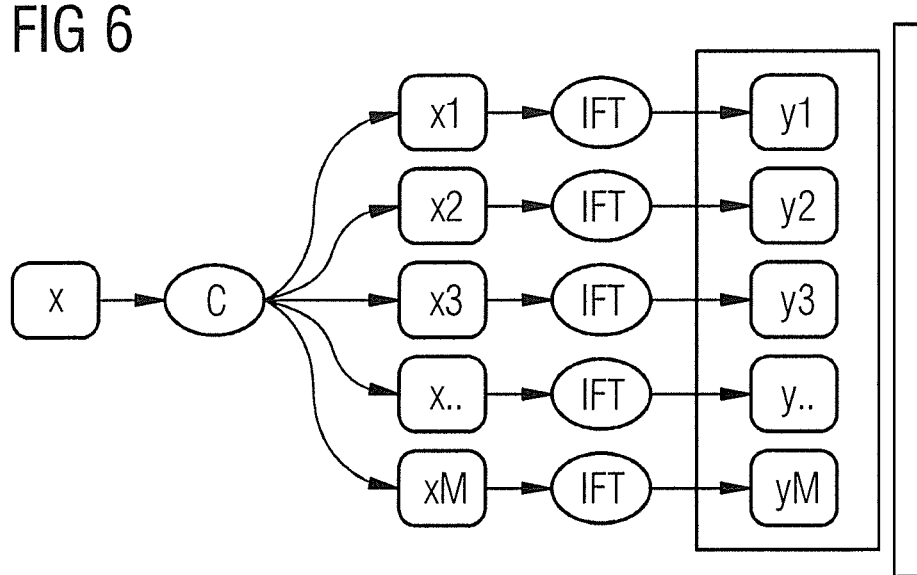

The transformation from the raw data set into the image space and vice versa is schematically depicted in FIGS. 5 and 6. C means the multiplication with the coil sensitivity data; C* is the complexly conjugated operation.

Direct methods to solve this equation system are known (for example what is known as the SENSE method), wherein the matrix A is inverted with the pseudo-inverse matrix:

$$x = (A^H A)^{-1} A^H y. \qquad (3)$$

Given iterative reconstruction methods, a mostly undersampled raw data space is calculated step by step starting from an initial estimate.

In each iteration step, the currently calculated image is multiplied with the reconstruction matrix A that, in addition to the Fourier coefficients, also includes the coil profiles. The current error is subsequently calculated and minimized with the aid of optimization methods. This results in a new estimate. A final image results after multiple iterations. This means that, instead of a direct inversion, a minimization problem of the following form is solved:

$$\min_x \|Ax - y\|. \qquad (4)$$

Among other things, the steps shown in FIG. 7 are hereby implemented.

An exemplary iterative method includes the following steps.

By incorporating the coil information, the difference of the current intermediate state from the measured raw data is calculated. By minimizing this difference, a new intermediate result $x_{-k+1}$ results.

In detail, the steps are as follows:

After the start of the method in Step S1, in a step S2 $A^H A x_k$ is calculated, wherein H is the hermetic matrix. In a further step S3, $A^H y$ is calculated, and the minimization of the difference from Step S2 and S3 subsequently results in a step S4. Resulting from this in Step S5 is a value $x_{k+1}$ that can be used for the subsequent iteration. In Step S6 a check is made as to whether the minimization has been achieved. For example, the minimization can be interrupted after a maximum number of iteration steps, or when the iteratively calculated MR image has a satisfactory quality. If this is not the case, the iteration is repeated in a next step. The method ends in Step S7.

An information about the image acquisition can additionally be used in the calculation, which information enters into the calculation as regularization or, respectively, penalty terms:

$$\min_x \{\|y - Ax\| + \lambda \|G(x)\|\}. \qquad (5)$$

The latter term of the addition is what is known as the regularization or, respectively, penalty term. The coil information is included in A; G(x) includes additional regularizations such as (for example) total variation or terms that take into account anatomical information from adjacent slices. How strongly the penalty term is weighted can be specified with the parameter $\lambda$.

Particularly in MR angiography images, the method described above leads to very good results. Given acquisition of multiple slices, these slices can be acquired successively or in an interleaved manner, and the acquisition pattern can be modified or permuted across the slices. The known view sharing algorithm can thus be used, wherein data of other temporally adjacent data sets are also used to reconstruction a data set.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to generate magnetic resonance (MR) images of an examination subject, comprising:
   operating a magnetic resonance data acquisition unit to excite nuclear spins in an examination subject and to detect MR signals simultaneously with multiple coils that occur as a result of the excitation, each of said multiple coils having an individual coil characteristic;
   entering data representing said MR signals into a memory representing a raw data space having a central raw data region and a further region outside of said central raw data region, by incompletely filling said raw data space with said signals representing said MR signals and undersampling said central raw data region with a coherent acquisition pattern comprised of a spatially repeating set of raw data points, and sampling said further region with an incoherent acquisition pattern; and
   in a processor, reconstructing an MR image from the data in said raw data space using a step-by-step iterative reconstruction algorithm with a reconstruction matrix starting from an initial estimate, said reconstruction matrix comprising information describing the respective individual coil characteristics of said multiple coils.

2. A method as claimed in claim 1 comprising scanning said central raw data region to maintain a density of the raw data points therein substantially constant.

3. A method as claimed in claim 1 wherein said raw data space comprises a plurality of lines, and wherein each Nth line of said raw data space in said central raw data region is acquired with N≥2, and with an interval of adjacent lines continuously increasing in said further region.

4. A method as claimed in claim 1 wherein said raw data space is 3-dimensional and comprises parallel lines on a Cartesian grid, and entering said data representing said MR signals in every Nth line in one spatial direction, with N≥2.

5. A method as claimed in claim 4 comprising entering said data representing said MR signals in every Mth line in a second spatial direction in said central raw data region.

6. A method as claimed in claim 1 comprising employing a penalty term containing said information describing said individual coil characteristics, in said iterative reconstruction algorithm.

7. A method as claimed in claim 6 comprising obtaining said information describing said coil characteristics from said central raw data region.

8. A method as claimed in claim 1 comprising acquiring multiple data sets of said MR signals in a sequence and, in temporally successive data sets in said sequence, entering said data representing said MR signals into said raw data space to cause different raw data points in said raw data space to be filled in temporally successive raw data sets.

9. A method as claimed in claim 8 comprising generating said successive data sets in said central raw data region by at least one procedure selected from the group consisting of displacement, mirroring, and rotation.

10. A method as claimed in claim 1 comprising reconstructing said MR image using subtraction MR images.

11. A method as claimed in claim 1 comprising employing an algorithm for said image reconstruction that shows blood vessels in said MR image.

12. A magnetic resonance apparatus comprising:
   a magnetic resonance data acquisition unit comprising multiple reception coils, each of said multiple coils having an individual coil characteristic;
   a control unit configured to operate said magnetic resonance data acquisition unit to excite nuclear spins in an examination subject and to detect MR signals, simultaneously with said multiple coils, that occur as a result of the excitation;
   said control unit being configured to enter data representing said MR signals into a memory representing a raw data space having a central raw data region and a further region outside of said central raw data region, by incompletely filling said raw data space with said signal representing said MR signals and undersampling said central raw data region with a coherent acquisition pattern comprised of a spatially repeating set of raw data points, and sampling said further region with an incoherent acquisition pattern; and
   a processor configured to reconstruct an MR image from the data in said raw data space using a step-by-step iterative reconstruction algorithm with a reconstruction matrix starting from an initial estimate, said reconstruction matrix comprising information describing the respective individual coil characteristics of said multiple coils.

* * * * *